United States Patent
Thyagarajan et al.

(10) Patent No.: US 10,153,731 B2
(45) Date of Patent: Dec. 11, 2018

(54) APPARATUS AND METHOD FOR OPERATING A POWER AMPLIFIER ARRAY WITH ENHANCED EFFICIENCY AT BACK-OFF POWER LEVELS

(71) Applicant: RF Pixels, Inc., Fremont, CA (US)

(72) Inventors: Siva V. Thyagarajan, San Jose, CA (US); Ali M. Niknejad, Berkeley, CA (US); Sriramkumar Venugopalan, Campbell, CA (US)

(73) Assignee: RF Pixels, Inc., Fremont, CA (US)

( * ) Notice: Subject to any disclaimer, the term of this patent is extended or adjusted under 35 U.S.C. 154(b) by 13 days.

(21) Appl. No.: 15/791,312

(22) Filed: Oct. 23, 2017

(65) Prior Publication Data

US 2018/0115282 A1    Apr. 26, 2018

Related U.S. Application Data

(60) Provisional application No. 62/412,217, filed on Oct. 24, 2016.

(51) Int. Cl.
*H04B 1/04* (2006.01)
*H03F 1/02* (2006.01)
(Continued)

(52) U.S. Cl.
CPC ............ *H03F 1/02* (2013.01); *H03F 1/0277* (2013.01); *H03F 3/19* (2013.01); *H03F 3/211* (2013.01); *H03F 3/2175* (2013.01); *H03F 3/24* (2013.01); *H03F 3/245* (2013.01); *H03G 3/3042* (2013.01); *H04B 1/0458* (2013.01); *H03F 2200/451* (2013.01); *H04B 2001/045* (2013.01); *H04B 2001/0416* (2013.01)

(58) Field of Classification Search
CPC ........... H04B 1/04; H04B 1/0485; H04L 1/02; H04L 3/211; H04L 3/2175; H03F 3/24; H03G 3/3042; H04W 52/04
See application file for complete search history.

(56) References Cited

U.S. PATENT DOCUMENTS

| | | |
|---|---|---|
| 8,463,324 B1 | 6/2013 | Kormanyos et al. |
| 9,137,067 B1 | 9/2015 | Xie et al. |

(Continued)

FOREIGN PATENT DOCUMENTS

WO    WO-2016/054440 A1    4/2016

OTHER PUBLICATIONS

International Search Report dated Jan. 5, 2018, for PCT Application No. PCT/US2017/058140, filed on Oct. 24, 2017, 2 pages.
(Continued)

*Primary Examiner* — Thanh Le
(74) *Attorney, Agent, or Firm* — Cooley LLP

(57) ABSTRACT

An apparatus, comprising has an array of power amplifiers. A power detector collects a power signal applied to the array of power amplifiers. Digital logic is connected to the array of power amplifiers and the power detector. The digital logic is configured to evaluate the power signal and select an array pattern from a set of array patterns and generate a control signal to implement the array pattern on the array of power amplifiers. Each array pattern in the set of array patterns includes at least one operative power amplifier.

16 Claims, 14 Drawing Sheets

(51) Int. Cl.
    *H03F 3/21*     (2006.01)
    *H03F 3/24*     (2006.01)
    *H03F 3/217*    (2006.01)
    *H03G 3/30*     (2006.01)
    *H03F 3/19*     (2006.01)

(56) References Cited

U.S. PATENT DOCUMENTS

| | | |
|---|---|---|
| 2001/0001548 A1 | 5/2001 | Ishida et al. |
| 2008/0261534 A1* | 10/2008 | Wang .............. H04W 52/04 455/67.11 |
| 2009/0303125 A1 | 12/2009 | Caille et al. |
| 2012/0299765 A1 | 11/2012 | Huang et al. |
| 2012/0319772 A1* | 12/2012 | Chang .............. H03F 3/24 330/124 R |
| 2013/0070741 A1 | 3/2013 | Li et al. |
| 2014/0087673 A1 | 3/2014 | Mostov et al. |
| 2016/0049823 A1 | 2/2016 | Stein et al. |
| 2016/0087339 A1 | 3/2016 | Bull et al. |
| 2016/0285481 A1* | 9/2016 | Cohen .............. H04B 1/04 |

OTHER PUBLICATIONS

Written Opinion of the International Searching Authority dated Jan. 5, 2018, for PCT Application No. PCT/US2017/058140, filed on Oct. 24, 2017, 7 pages.

* cited by examiner

Near
Few PA Pixels Are Turned On. The Transmitted Average Power Is Backed-off From The Maximum.

Far
All PA Pixels Are Turned On. The Transmitted Average Power Is At Its Maximum.

APPARATUS AND METHOD FOR OPERATING A POWER AMPLIFIER ARRAY WITH ENHANCED EFFICIENCY AT BACK-OFF POWER LEVELS

CROSS-REFERENCE TO RELATED APPLICATION

This application claims priority to U.S. Provisional Patent Application Ser. No. 62/412,217, filed Oct. 24, 2016, the contents of which are incorporated herein by reference.

FIELD OF THE INVENTION

This invention relates generally to wireless communication systems. More particularly, this invention relates to techniques for operating a power amplifier array with enhanced efficiency at back-off power levels.

BACKGROUND OF THE INVENTION

Power amplifiers are critical blocks in wireless communication systems. The efficiency of a transceiver is determined primarily by the performance of the power amplifier. The design of the power amplifier involves a tradeoff between linearity and efficiency. The efficiency of a power amplifier in general decreases with reduction in transmitted output power. This poses an issue in the design of efficient power amplifiers. Modern day communication systems utilize higher order complex modulation schemes to maximize the capacity of the channel. This results in a signal waveform that has a high peak to average power ratio (PAPR). In order to preserve the fidelity of the transmitted signal, the power amplifier must operate at an average power level that is significantly lower than the peak achievable power (typically 10 dB back-off). As used herein, back-off power level is a power level that is significantly lower than the peak achievable power, such as a 10 dB back-off from peak achievable power. Operating at a back-off power level results in efficiency degradation at the expense of better linearity. Hence, an efficient power amplifier or transmitter architecture would be one that boosts efficiency at back-off power levels without compromising linearity.

Typically power amplifier designs involve Class A/B/AB architectures that are linear but less efficient in nature. Several techniques have been proposed in literature to counteract this tradeoff. Some of these advanced architectures include envelope tracking, Doherty power amplifier, dynamic load modulation, out-phasing linear amplification using non-linear components (LINC), polar modulation (Envelope Elimination and Reconstruction), digital power amplifier architecture, pulse width modulation and switched capacitor power amplifier architectures. These architectures enhance the efficiency of power amplifiers to some degree but in general these are not efficient for complex modulation schemes. Additionally, due to the complex nature of these architectures, the efficiency-linearity tradeoff now manifests itself as a challenge in the design of other critical blocks. For example, in an out-phasing LINC architecture, the use of switching power amplifiers boosts the efficiency of the system; however, the design of the output power combiner becomes a challenge. In a multi element antenna array system, the efficiency of each power amplifier element dictates the total power consumption of the system. Due to the increased number of elements in a massive multiple-input and multiple-output (MIMO) system, the efficiency of each element becomes important. Using the above techniques in a multi element antenna array system would not be beneficial as they attempt to enhance the efficiency of each element. With power back-off, each power amplifier pixel or element operates at a lower power level thereby degrading the overall efficiency of the system.

In view of the foregoing, it would be desirable to provide an efficient power amplifier or transmitter architecture that boosts efficiency at back-off power levels without compromising linearity.

SUMMARY OF THE INVENTION

An apparatus, comprising has an array of power amplifiers. A power detector collects a power signal applied to the array of power amplifiers. Digital logic is connected to the array of power amplifiers and the power detector. The digital logic is configured to evaluate the power signal and select an array pattern from a set of array patterns and generate a control signal to implement the array pattern on the array of power amplifiers. Each array pattern in the set of array patterns includes at least one operative power amplifier.

BRIEF DESCRIPTION OF THE FIGURES

The invention is more fully appreciated in connection with the following detailed description taken in conjunction with the accompanying drawings, in which:

FIG. 4 illustrates a process in accordance with an embodiment of the invention for selecting the required number of array elements to be turned on.

Like reference numerals refer to corresponding parts throughout the several views of the drawings.

DETAILED DESCRIPTION OF THE INVENTION

Figure 1:
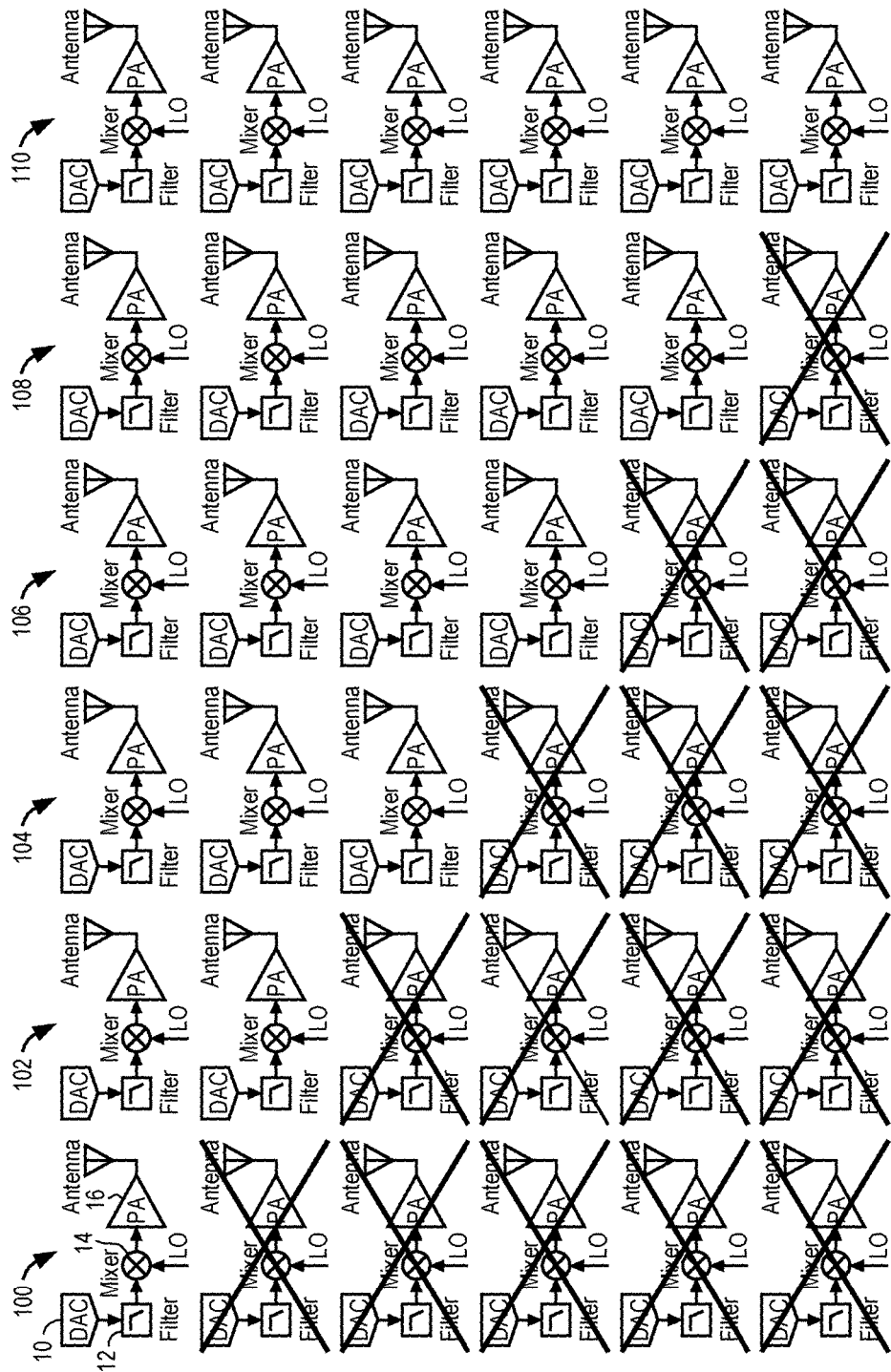
FIG. 1 illustrates a switching pixel power amplifier architecture with a six antenna array system.

This invention considers the antenna array system as a whole and describes a switching "pixel" (or multi antenna array) power amplifier (or alternatively transmitter) architecture that involves intelligent switching on and off of power amplifier or transmit element pixels. By leveraging the fact that the antenna pattern remains relatively constant as the elements are turned on or off, this invention significantly enhances the efficiency of the system at back-off power levels.

An embodiment of the invention is a switching "pixel" power amplifier (PA) architecture for enhanced efficiencies at back-off power levels. Back-off power levels are power levels of operations that are lower than the maximum achievable PA output power. Therefore, a 10 dB back-off implies a power level of operation that is 10 times lower than the maximum achievable output power. This architecture is conducive to systems that utilize multiple antennas to support numerous spatial streams, beamforming and massive MIMO systems. This invention describes a generic architecture that is frequency agnostic and encompasses the entire frequencies range (from the low kilohertz to Terahertz frequencies). It can be used for both static (when the user is closer or away from the base station) and dynamic power back-off (as the transmitted signal envelope varies) cases. Although this architecture has been described with regard to the power amplifier, the same concepts in general apply to a transmitter chain as well.

The "pixel" power amplifier architecture comprises multiple power amplifiers (or transmitters) each one driving its own antenna element. Each amplifier contributes to the effective output power radiated by the antenna array. In order to change the transmitted output power, the output power of the pixel elements needs to be varied. This is done by varying the output power of one pixel element while the others operate at their maximum power (efficiency) levels. Once the required output power drops below a cut-off point, the current pixel element is turned off and the next element starts operating in a continuous manner, while the other transmitters still operate at their maximum power levels. This continues as the required power level varies.

This invention illustrates the fact that the beam pattern of a large antenna array is relatively unchanged when a unit element (or multiple elements) are powered on or off. Hence, by turning on or off one pixel at a time (as opposed to the whole array), one could achieve higher efficiency for back-off power levels of operation. This invention also describes a method of choosing the antenna elements carefully to minimize side-lobes in the antenna pattern at back-off power levels. Various configurations are feasible; however depending on the array size, certain configurations preserve the original antenna pattern for a larger range of output power levels. The pattern can also be preserved or modified by incorporating reconfigurable gain and phase elements in the transmit path. These elements change the gain and phase coefficients depending on the output power levels.

In cases where preserving the antenna pattern is very essential, this invention describes an antenna switching scheme that redistributes the output power from the active pixels to all the antennas. The output power from the active pixels are first combined together and relative phase shifts are applied on this composite signal before being transmitted by the antenna elements. The disclosed techniques can also be used in a multi-user massive MIMO system. Instead of one signal (as in the case of beamforming), the output of each pixel element will be a composite signal comprising multiple spatial streams. To achieve spatial filtering and multiple streams, each composite signal is phase shifted as in the case of beamforming and transmitted through the antenna array.

An embodiment of the invention is a switching pixel power amplifier architecture that enhances the back-off efficiency of the system by intelligently turning on or off unit elements. This architecture allows the design of efficient systems that are cost effective (due to low cost thermal solutions), have longer battery life and are feasible for portable applications. The disclosed technology can be applied to RF systems below 10 GHz, microwave systems below 30 GHz and mm-wave and beyond systems above 30 GHz. Although this architecture is described with regard to a communication system, the same concept can also be applied in imaging, heating and other applications.

The switching pixel power amplifier (PA) architecture is described with regard to a six antenna array system as shown in FIG. 1. However, this can be easily extended to any number of antenna elements. Every antenna element is part of a transmitter chain that comprises various blocks such as digital-to-analog (DAC) converter 10, filter 12, mixer 14 and power amplifier 16. They could also include other blocks such as variable gain amplifiers and phase shifters. In order to achieve beamforming, relative phase shifts are applied between the individual transmitter chains. This could be achieved by using phase shifters. Typical designs involve implementation at radio frequencies (RF), local oscillator (LO) and intermediate frequencies (IF). With N elements (here N=6), the equivalent isotropic radiated power (EIRP) is given as EIRP(dBm)=$20 \log(N) + P_{elem}$ (dBm), where $P_{elem}$ is the power transmitted by each PA element. When the minimum EIRP is desired, only one of the PA elements is turned on as shown in transmitter chain group 100. As the EIRP requirement increases, a number of PA elements are turned on accordingly, as shown with transmitter chain groups 102-108. The maximum EIRP is achieved when all the elements are turned on as shown with transmitter chain group 110. The change in EIRP per switch is given as $20 \log(N_i/N_j)$ where $N_i$ is the number of elements that are ON after switching and $N_j$ the number of elements ON before switching.

Figure 2:
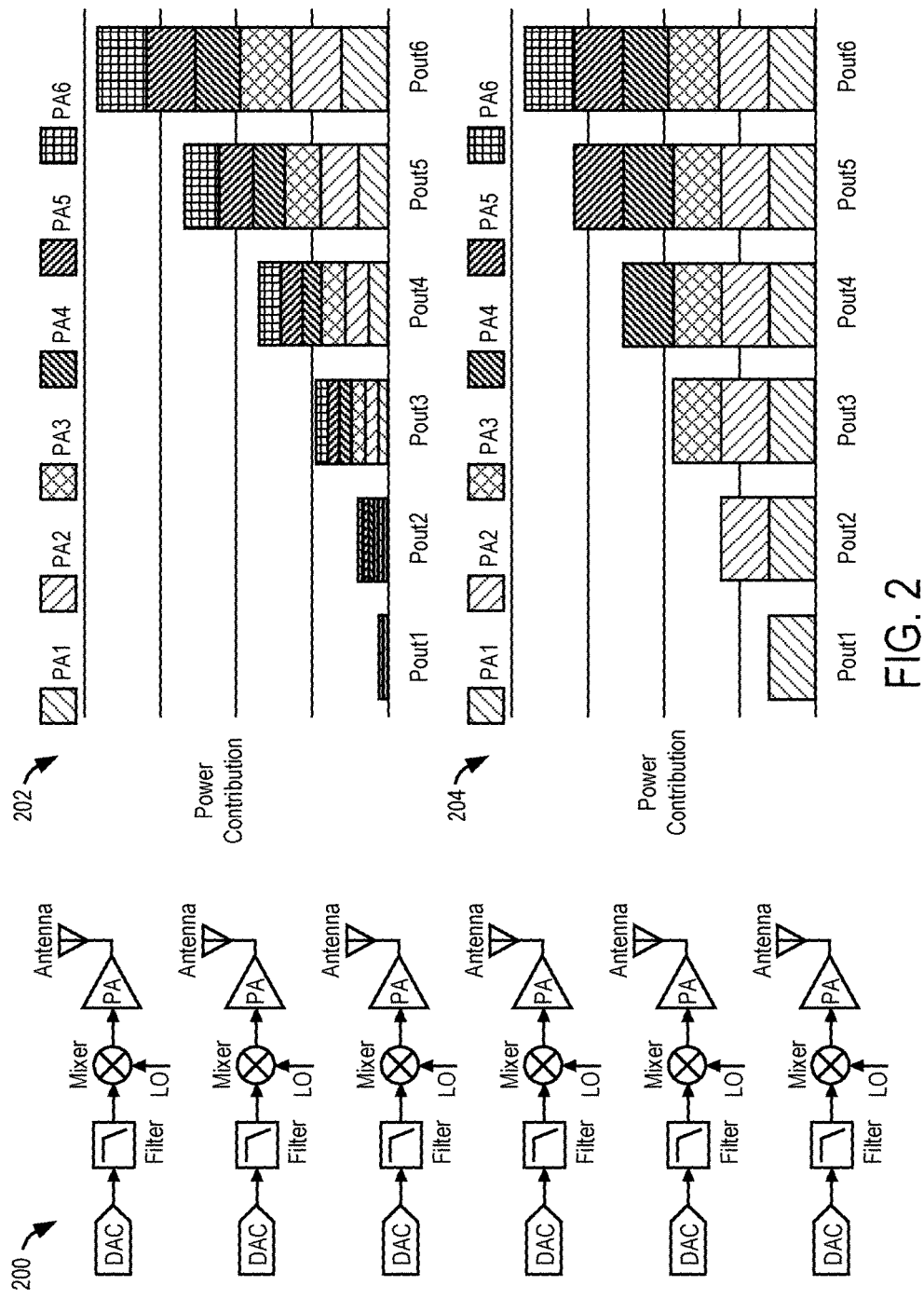
FIG. 2 illustrates a six antenna array system 200 with an output power contribution 202 for a traditional power amplifier architecture and a switching pixel power amplifier architecture 204 in accordance with an embodiment of the invention.

In traditional PA architectures and their corresponding array implementations, the EIRP is reduced by decreasing the output power of all the PA elements as shown in graph 202 of FIG. 2. In this case, the power contribution from each PA element is equal for different total power levels (from $P_{out1}$ to $P_{out6}$). However, in the switching pixel power amplifier architecture case as shown in graph 204, only one PA operates for the minimum output power level $P_{out1}$ and all PAs are ON for the maximum output power level of $P_{out6}$. Mid power levels are achieved by turning ON PA elements one at a time. It must be noted that this architecture is different compared to a digital PA architecture, where the PA is segmented into multiple unit elements and output power control is achieved by turning on or off these elements. The PA drives a single antenna or an antenna array and the output power changes in steps (in a digital manner). However, in a switching pixel power amplifier architecture, multiple unit elements drive multiple antennas (usually one element per antenna). Additionally, unlike a digital PA where the output power changes in equal steps and requires a high resolution; in a switching pixel power amplifier architecture, the output power is continuous. For example, in a six antenna array system, if $P_{elem}$=8 mW (≈9 dBm), the switching pattern and the EIRP is given as $$\begin{cases} PA1 \text{ ON}; & EIRP \leq 9 \text{ dBm} \\ PA1 \text{ 9 dBm}, PA2 \text{ ON}; & 9 \text{ dBm} \leq EIRP \leq 15.1 \text{ dBm} \\ PA1\text{-}2 \text{ 9 dBm each}, PA3 \text{ ON}; & 15.1 \text{ dBm} \leq EIRP \leq 18.6 \text{ dBm} \\ PA1\text{-}3 \text{ 9 dBm each}, PA4 \text{ ON}; & 18.6 \text{ dBm} \leq EIRP \leq 21.1 \text{ dBm} \\ PA1\text{-}4 \text{ 9 dBm each}, PA5 \text{ ON}; & 21.1 \text{ dBm} \leq EIRP \leq 23 \text{ dBm} \\ PA1\text{-}5 \text{ 9 dBm each}, PA6 \text{ ON}; & 23 \text{ dBm} \leq EIRP \leq 24.6 \text{ dBm} \end{cases}$$

In this case, one element is switched at a time. However, one could also switch more than one element at a time. Depending on the number of elements switched per stage, the output power change between the switch points is equal to 20 $\log(N_i/N_j)$. Between these switched states, the newly switched PAs operate in an analog manner and the old PAs transmit a fixed output power level.

Figure 3:
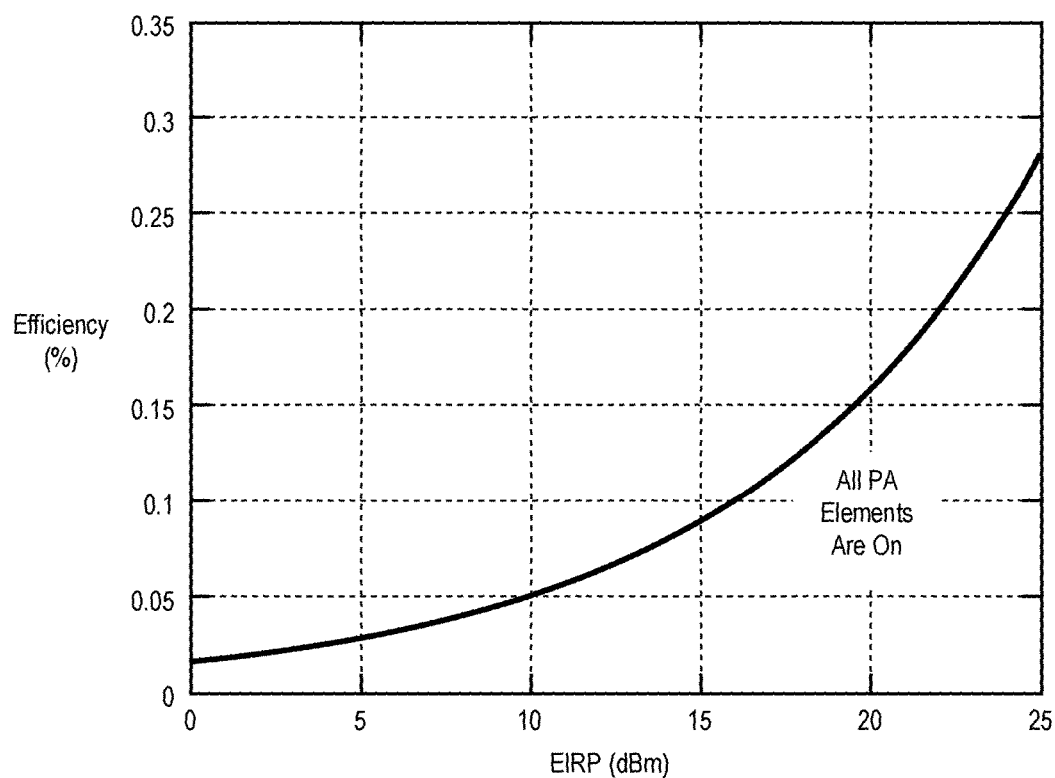
FIG. 3 illustrates performance of a traditional power amplifier architecture in which efficiency is a function of effective isotropic radiated power (EIRP).

The typical efficiency-EIRP (or output power) curve for a power amplifier is shown in FIG. 3. The efficiency of the PA is highest at the peak power point and reduces as one backs away from this peak power level. Today's communication systems utilize complex modulation schemes for transmitting data (for higher channel capacity) and have a large peak to average power ratio (PAPR). In order to amplify this signal preserving its fidelity, the PA must operate at a significant back-off from its peak power level (typically 10 dB). This results in significant efficiency degradation and increases the overall power consumption of the system. In this case, as shown in FIG. 3, the efficiency degrades from 28% to 8% for a 10 dB back-off. Therefore, a traditional PA architecture is not a feasible solution for applications that require high efficiency (such as portable devices).

The fundamental issue in a traditional PA architecture is the fact that all the PA elements need to transmit a signal that has a high PAPR. However, in a switching pixel power amplifier architecture, the output power changes are divided between the unit elements so that each unit element sees a signal with a significantly smaller PAPR. This results in an efficiency that is significantly better than traditional architectures. As described earlier, for any given instantaneous output power, all the PA elements except one operate at their peak power level and one PA element changes its output power based on the input signal.

Figure 4:
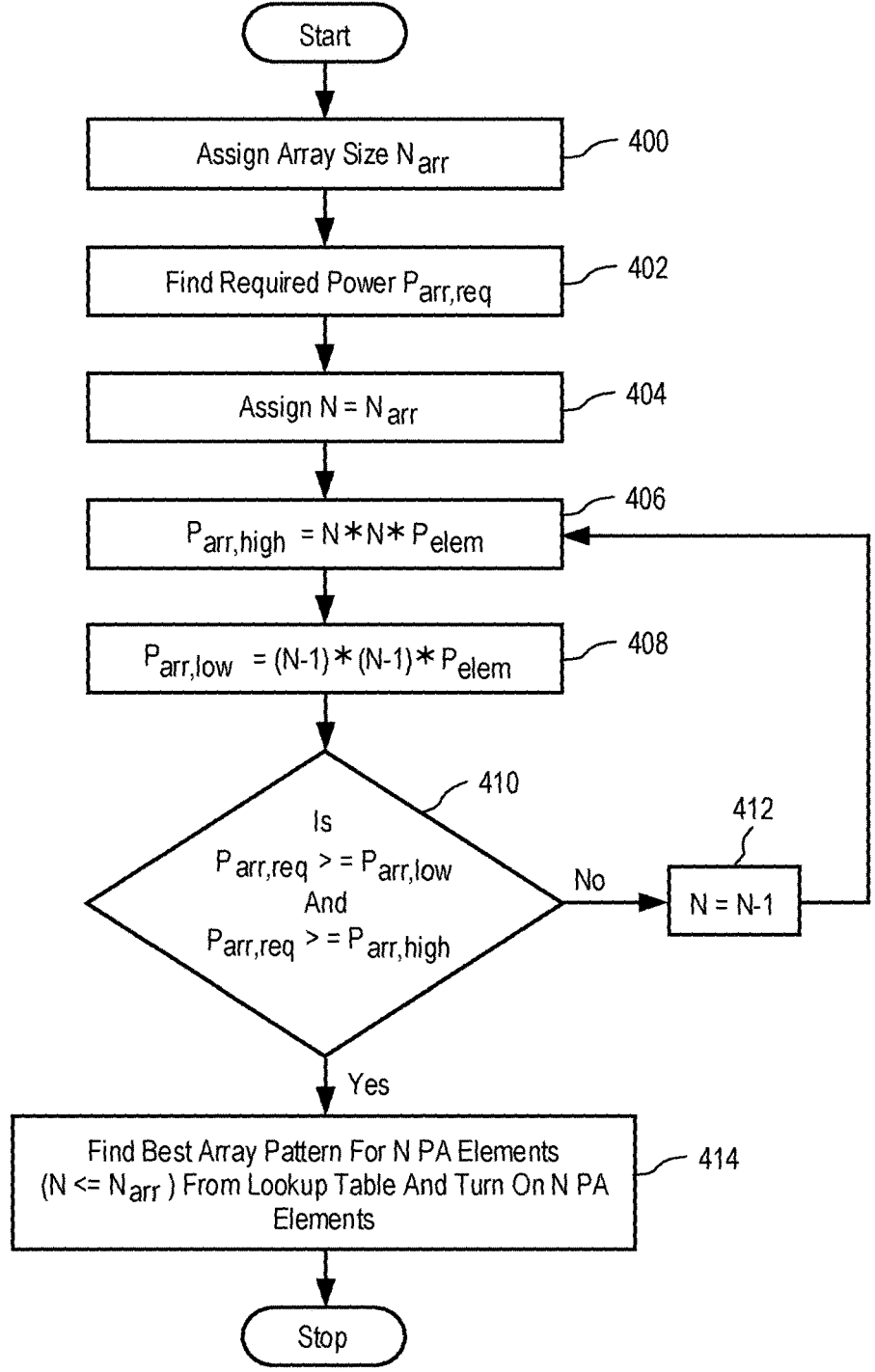

A process of selecting the number of active transmitter elements (elements that are turned ON) is shown in FIG. 4. Given the total array size $N_{arr}$, the maximum power per PA element $P_{elem}$ and the required total output power (equivalent isotropic radiated power or EIRP) $P_{arr, req}$, one could follow this simple algorithm to determine the number of transmitter chains that need to be turned on at any given time.

Initially, an array size $N_{arr}$ is assigned 400. Next, the required power for the array ($P_{arr, req}$) is found 402. A variable N is assigned the array size 404. A high power array value is then computed 406. Next, an incrementally lower power is computed 408. Block 410 tests for a condition in which the required power for the array is greater than or equal to the low power array value and less than the high power array value. If this condition is not satisfied (410—No), then the value N is decremented and control returns to blocks 406, 408 and 410. When the condition is satisfied (410—Yes), the best array pattern for N PA elements is selected (e.g., from a lookup table) and the N PA elements are turned on 414.

Figure 5:
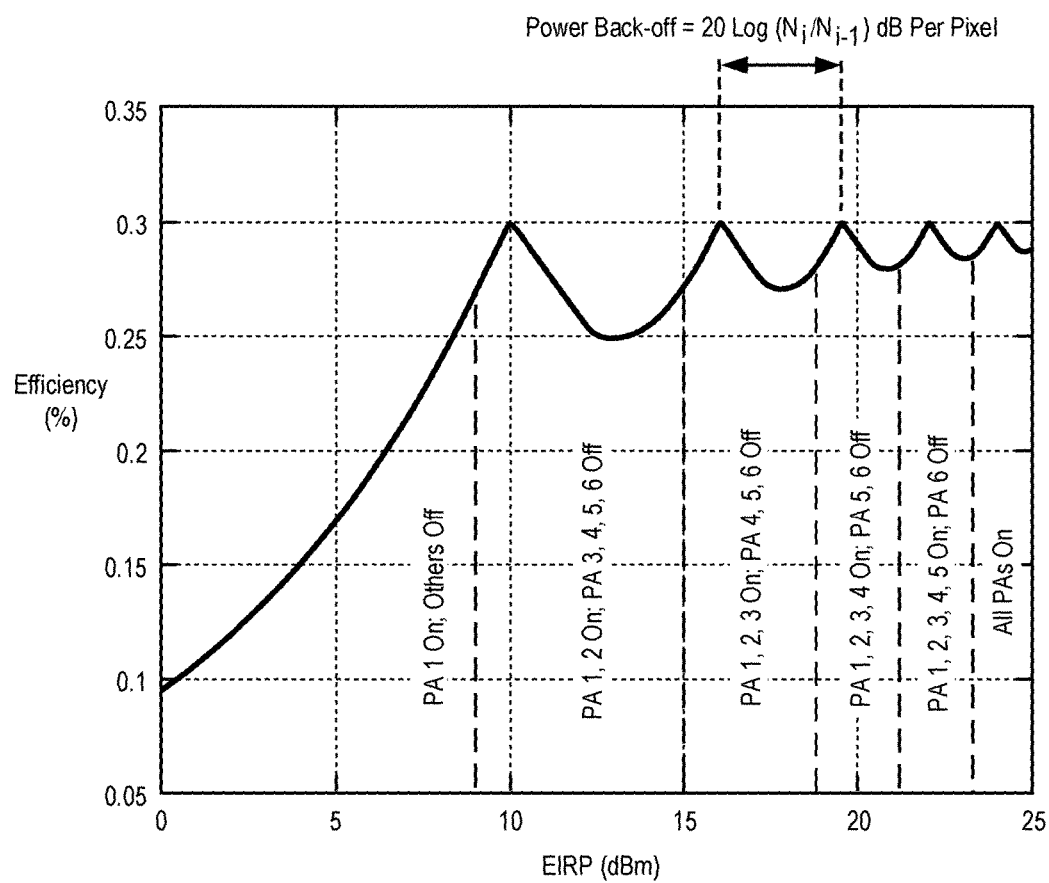
FIG. 5 illustrates performance of the disclosed switching pixel power amplifier architecture as a function of EIRP.

This process results in an almost constant efficiency curve as shown in FIG. 5. In this example, one element is switched at a time. However, one could also envisage this concept in cases where more than one element is switched at given time.

Figure 6:
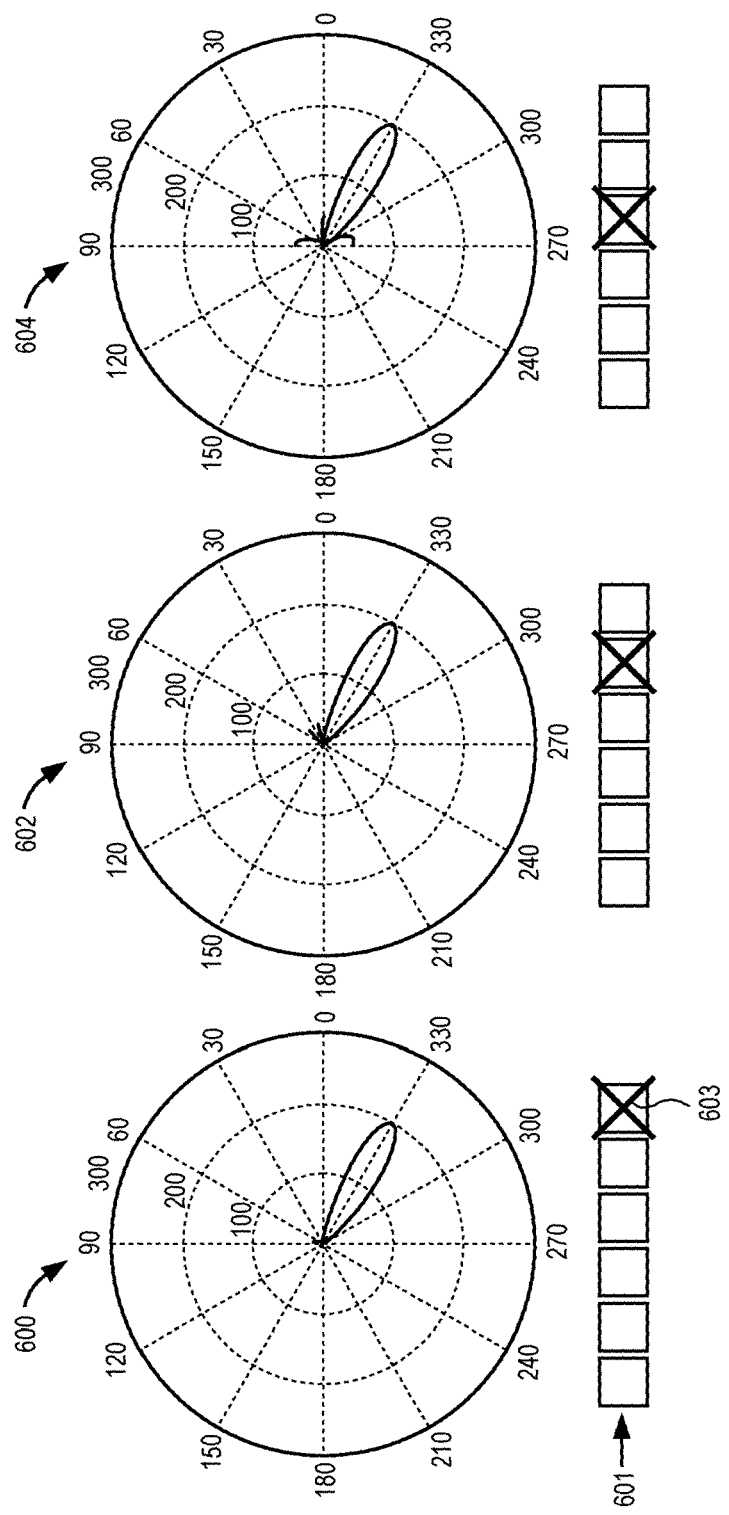
FIG. 6 illustrates a six antenna array system with an antenna pattern as a function of a single "OFF" power amplifier/transmit element.
Figure 7:
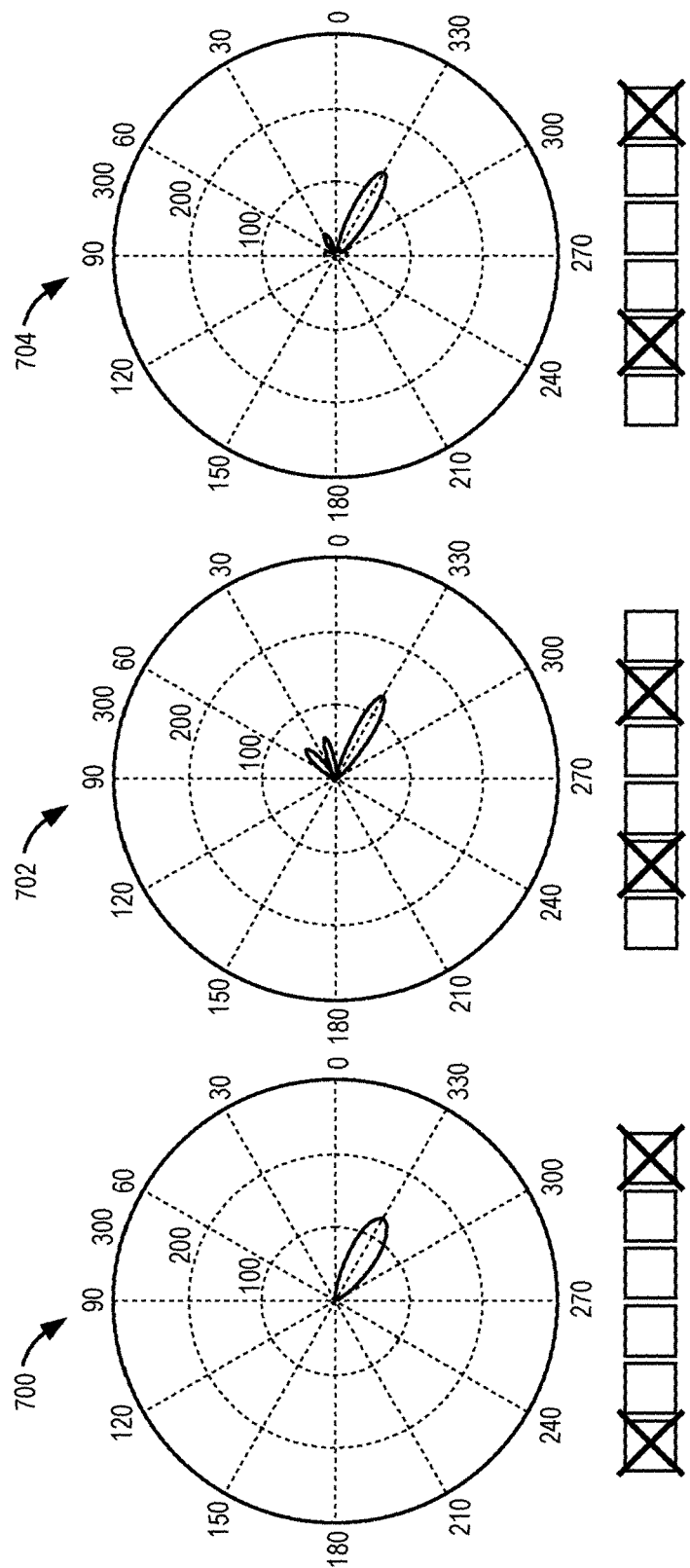
FIG. 7 illustrates a six antenna array system with an antenna pattern as a function of two "OFF" power amplifiers/transmit elements (I).
Figure 8:
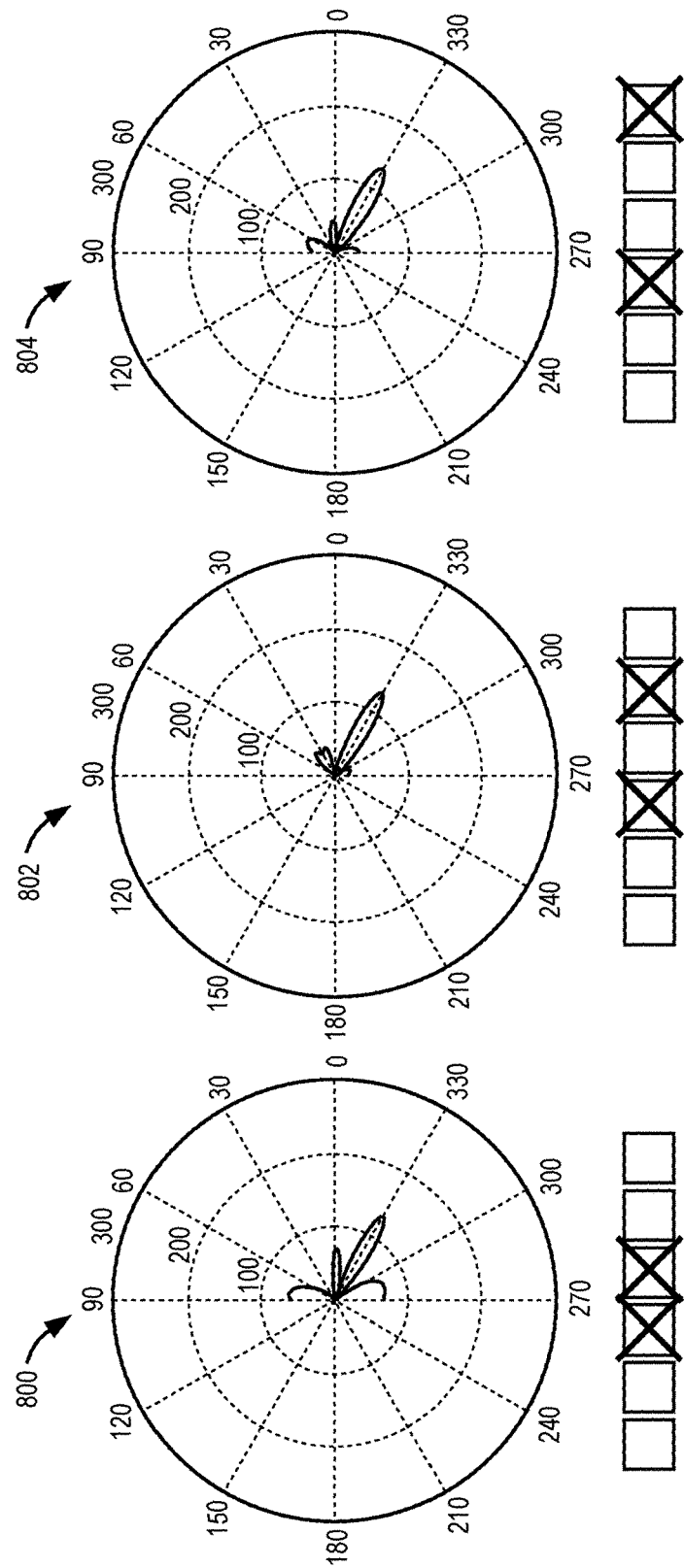
FIG. 8 illustrates a six antenna array system with an antenna pattern as a function of two "OFF" power amplifiers/transmit elements (II).
Figure 9:
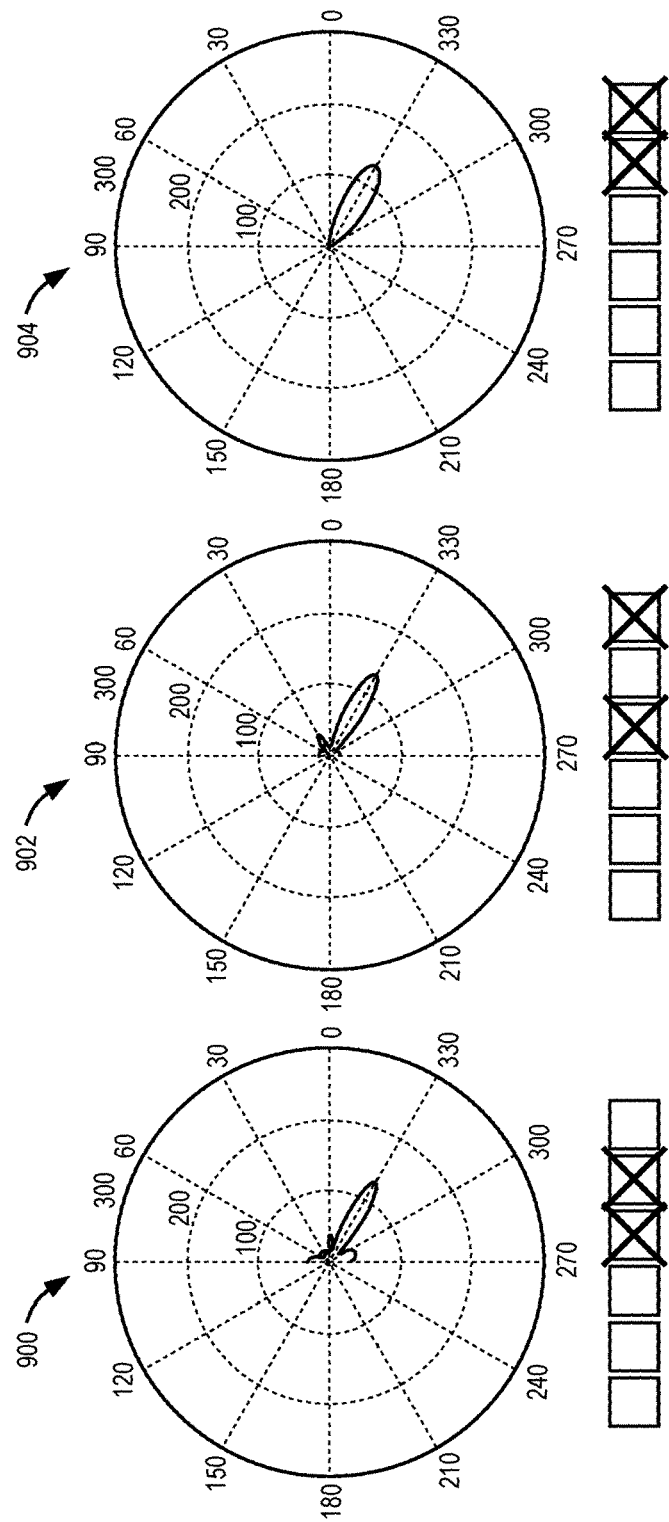
FIG. 9 illustrates a six antenna array system with an antenna pattern as a function of two "OFF" power amplifiers/transmit elements (III).

In order to implement the switching pixel power amplifier architecture, multiple PA elements need to be turned on and off depending on the required output power level. FIG. 6 shows one such example of a six array antenna system 601, with individual elements 603 selectively turned off, where the required EIRP is backed-off from the peak value by 20 log(6/5)≈1.6 dB. In order to achieve this back-off level, one pixel is switched off from the available six pixels. The antenna pattern for three configurations is shown. The other three possibilities are similar to these due to symmetry. As seen in the figure, the first pattern 600 is a potential candidate compared to the other two 602, 604 due to no unwanted lobes in the pattern. In a similar manner, one could plot the antenna pattern when the EIRP is backed off by 20 log(6/4)≈3.5 dB. As shown in FIG. 7, FIG. 8 and FIG. 9, nine possibilities exist each with a different side lobe pattern. The first pattern 700 in FIG. 7 and the last pattern 904 in FIG. 9 are the most desirable to avoid interference. Depending on the application, other patterns may be used. These results can be extended further to other back-off levels where many PA elements are switched on and off. By carefully analyzing the antenna pattern and considering the interference and EIRP requirements, the best antenna pattern can be selected automatically by the system.

Figure 10:
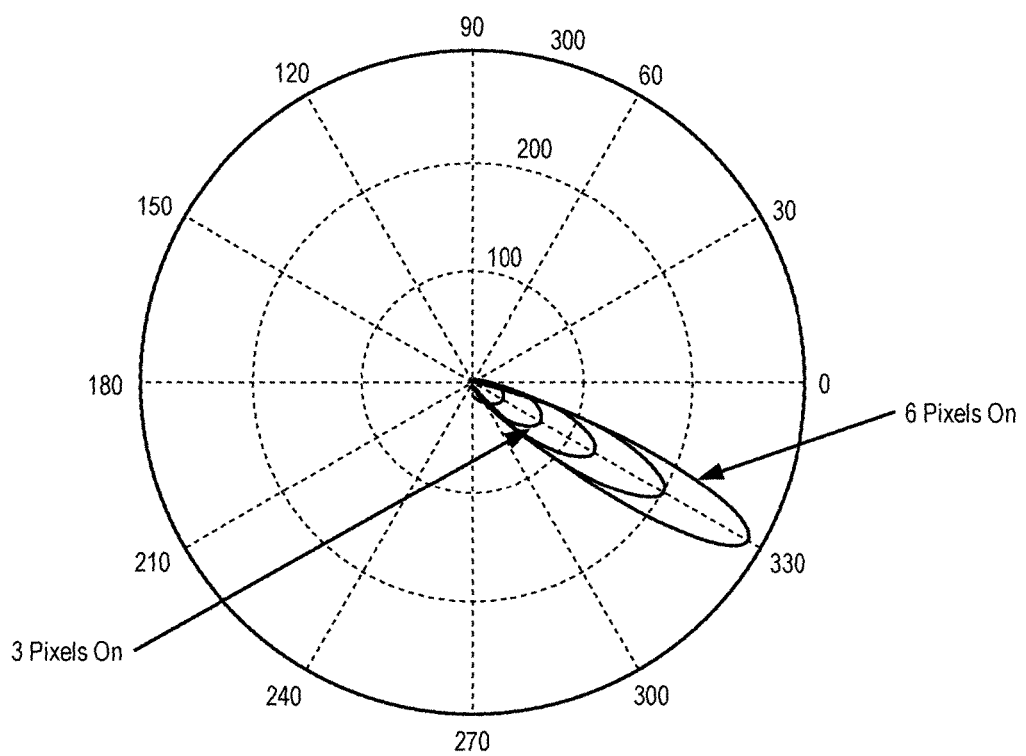
FIG. 10 illustrates performance of a six antenna array system with a switching pixel power amplifier (PA) architecture utilizing intelligent power amplifier switching for preserving antenna pattern.

FIG. 10 shows the antenna patterns for a six element array (using intelligent switching) with different back-off levels. As seen from the figure, it is possible to maintain the pattern (with minimal side lobes) under back-off conditions. Additionally, the phase and gain coefficients in each antenna element can be changed to compensate the change in antenna pattern as pixels are turned on and off. Even for the case where the antenna pitch is not half-wavelength, phase and gain control on the individual pixels would allow one to maintain the antenna pattern with back-off.

Figure 11:
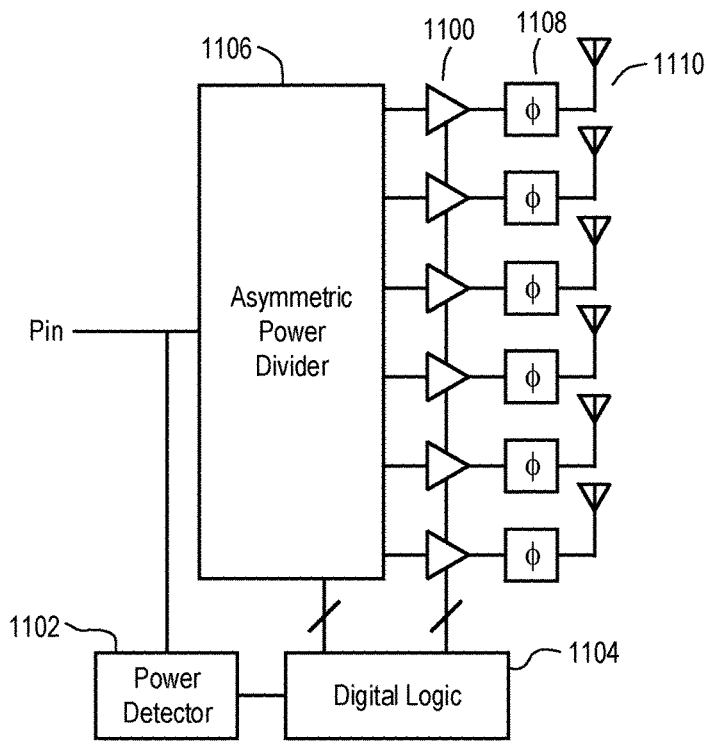
FIG. 11 illustrates a switching pixel power amplifier architecture implementation (I)

The switching pixel power amplifier architecture can be implemented in many ways. FIG. 11 shows one such implementation. It consists of six PA elements 1100 driving six antennas 1110 with a phase shifter per element 1108. The instantaneous input power is detected using a power detector 1102 which then passes the information to the digital logic 1104. One embodiment of the digital logic 1104 implements the operations of FIG. 4. Depending on the input power level, the digital logic 1104 turns on the required number of PAs to achieve the required EIRP level. The digital logic 1104 also controls the asymmetric power divider 1106 that dictates the flow of input power to the individual PA element. All the PA elements except one operate at a fixed input power level to output the maximum output linear power (with maximum efficiency). The one odd PA has an output power level that depends on the residual input power (total input power minus total input power to all the maximum output power PA elements) from the asymmetric power divider.

Figure 12:
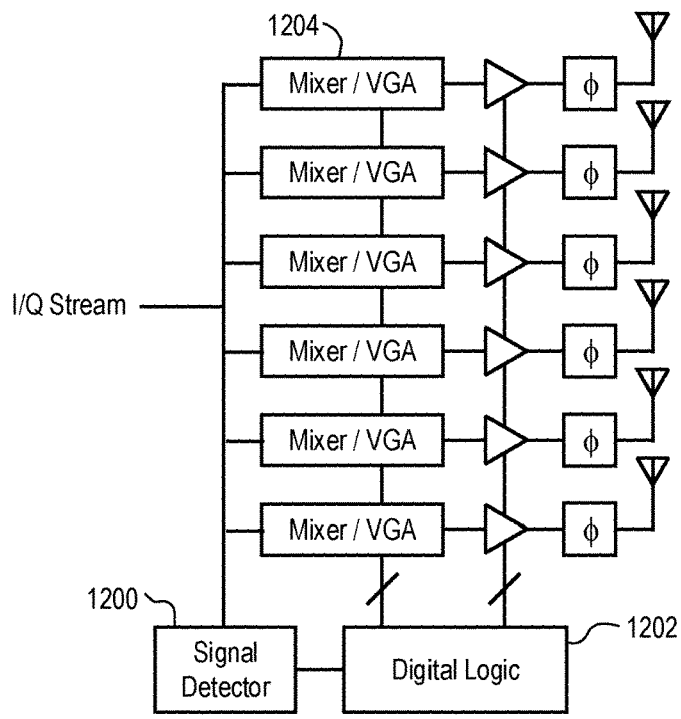
FIG. 12 illustrates a switching pixel power amplifier architecture implementation (II).

Another implementation where each pixel consists of blocks from baseband to the antenna is shown in FIG. 12. In this case, the input I/Q stream is passed through a signal detector 1200. The signal detector then passes its output to digital logic 1202 which controls the PA elements and the variable gain amplifiers (VGAs) 1204 in each pixel. This in turn controls the state of each PA pixel and the output EIRP.

Figure 13:
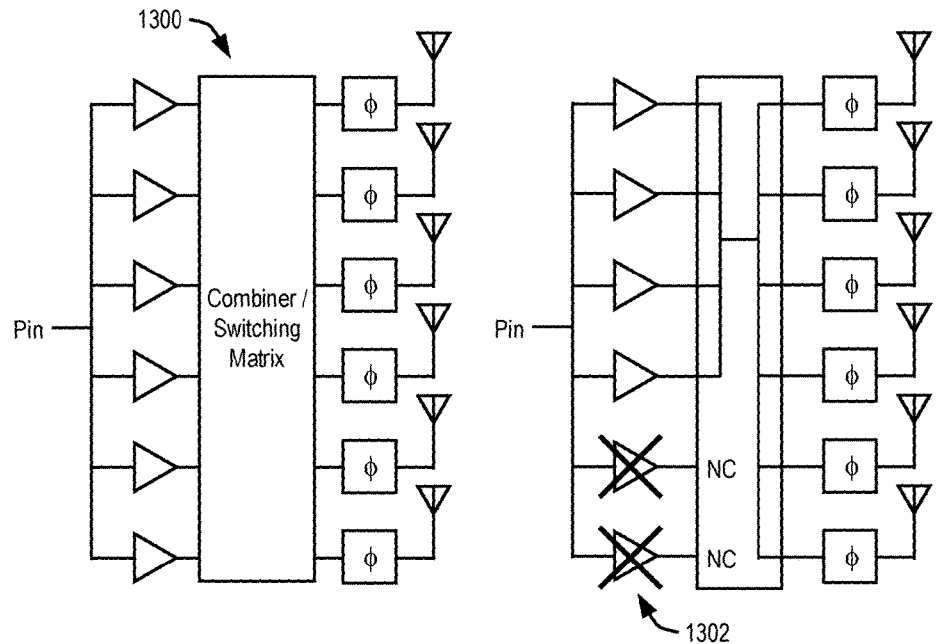
FIG. 13 illustrates an alternate switching pixel power amplifier architecture implementation (power redistribution) preserving antenna pattern.

An alternate implementation of this architecture is shown in FIG. 13. This architecture is similar to the previous one except for the fact that all the antennas are used during power back-off. In order to achieve this, a combiner or switching matrix block 1300 is inserted between the PAs and the antenna. A simple implementation of the scheme is shown on the right side of the figure. In this case, two PAs 1302 are turned off and the output power from the four PAs are combined together and then redistributed again to the antennas. Implementation of the combiner is a challenge in this architecture due to isolation requirements between the PA elements.

The switching pixel power amplifier architecture enhances the efficiency of the system by switching on and off pixels (antenna elements). If the required output power level is at the switch point, then the state of the antenna array changes frequently for minimal change in the output power level. In order to avoid this, hysteresis can be added in the digital control loop. For example, if the switch point is at $P_{out0}$, then the array switches on additional elements when $P_{out0} > P_{out0} + \Delta$ and switches off additional elements when $P_{out0} < P_{out0} - \Delta$, where $\Delta$ is a fixed power offset. This prevents excessive switching.

The transmission in most communication systems happens in bursts and this leads to a "dead zone" (period of no transmission) between different transmit packets. As the data on the transmit side is known a priori, this could be used for better pixel switching. By using the transmit packets before and after the "dead zone", the required antenna pattern for these waveforms can be estimated before transmission. The antenna array is then reconfigured during the "dead zone" period in order to avoid glitches during transmission.

Figure 14:
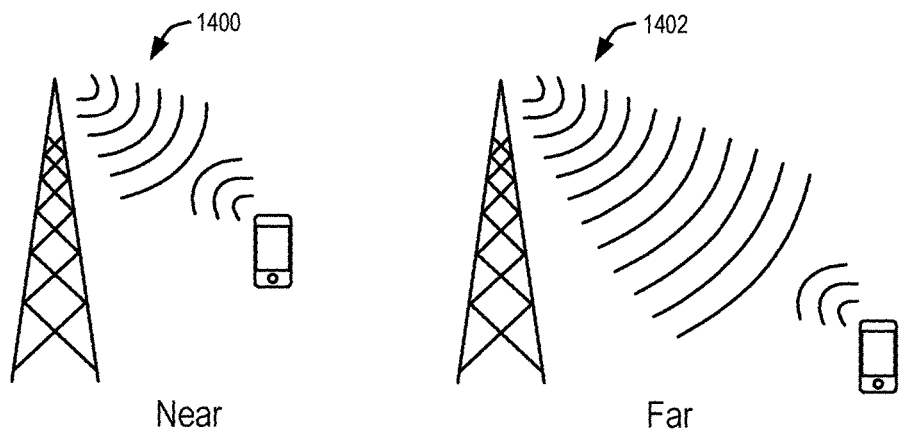
FIG. 14 illustrates a switching pixel power amplifier architecture application with static power back-off.

The switching pixel power amplifier finds application in all communication systems. In particular, two cases are discussed here. FIG. 14 shows an application employing static power back-off. Wireless systems require transmitter power control depending on the location of the client. When the client is near a base station 1400, the base station transmits lower average output power. When the client is far away from the base station 1402, the reverse is true. The same is the case when seen from the client side. Hence, there is a need to operate the PAs at different power levels depending on the location of the devices. The switching pixel power amplifier architecture easily achieves this by choosing the required number of PA elements to transmit the signal efficiently.

The power control can also be performed in a dynamic manner using the instantaneous output power (instead of average output power). In this case, the digital logic in the switching pixel power amplifier architecture tracks the instantaneous power at the transmitter output and turns on and off pixels as a function of this power level.

Figure 15:
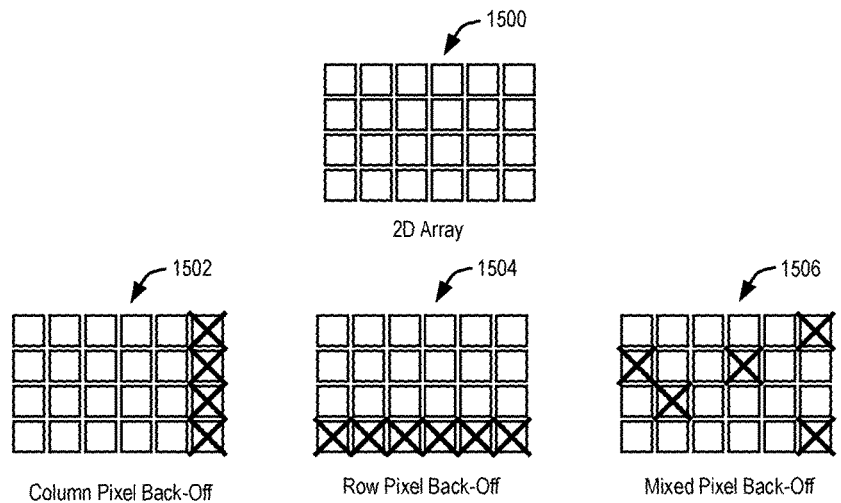
FIG. 15 illustrates a switching pixel power amplifier architecture implementation using a two dimensional array.

The switching pixel power amplifier architecture has been described till now with regard to a single dimensional array of antennas. However, the same can be extended to a two dimensional array as shown in FIG. 15. In this case, one could perform column pixel back-off 1502, where a complete column is switched or a row pixel back-off 1504, where a complete row is switching on and off or a mixed pixel back-off 1506. These are determined beforehand using simulations or experimental data to obtain the desired antenna pattern and programmed in the digital logic. The same concept can be extended to multi-dimensional antenna arrays or conformal antenna arrays.

Figure 16:
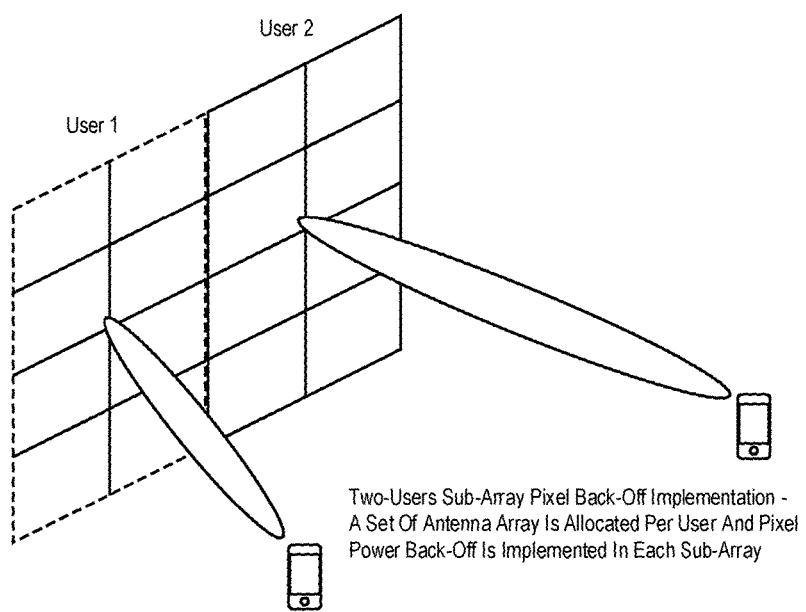
FIG. 16 illustrates a multi-user system with a sub-array switching pixel power amplifier architecture.
Figure 17:
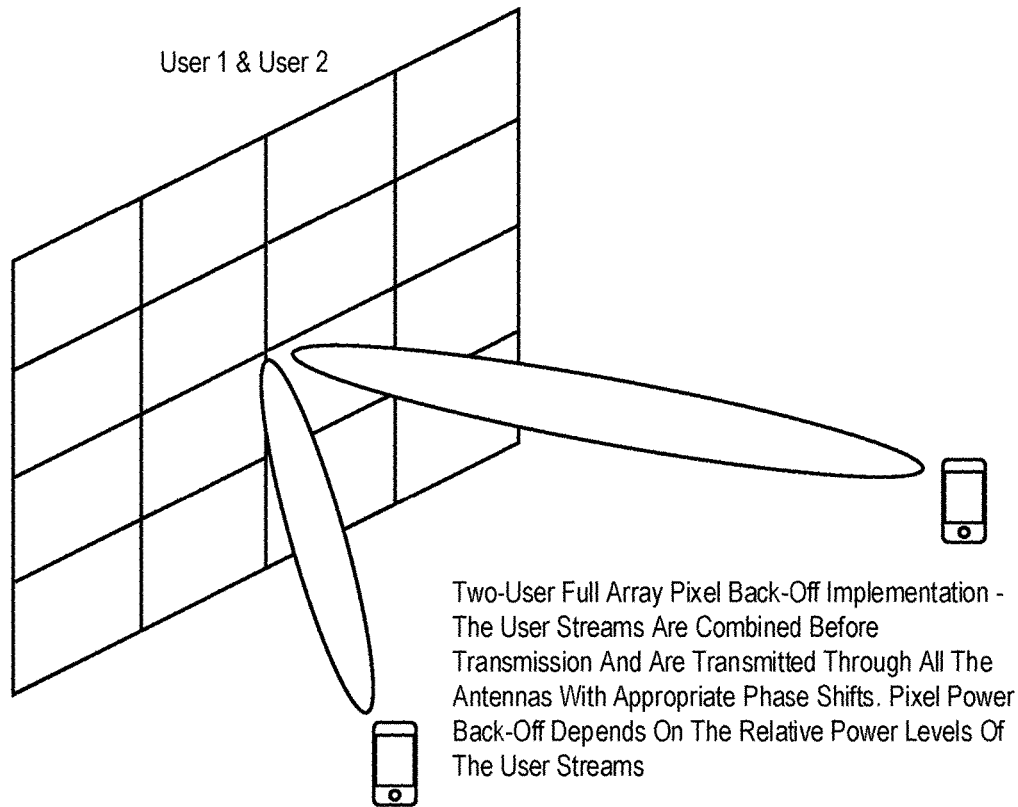
FIG. 17 illustrates a multi-user system with a full array switching pixel power amplifier architecture.

The above architecture has been described with regard to a single user, single output system. However, the same can be extended to a multi-user MIMO (multiple input multiple output) system too. Two possible implementations are feasible in this case. FIG. 16 shows a sub-array switching pixel power amplifier architecture implementation. In this case, two users are shown and each user is assigned a sub-array in the antenna array. The pixel power back-off is then performed in each sub-array. Another approach that utilizes the full antenna array aperture is shown in FIG. 17. Here, using back-end processing, two beams are transmitted from the antenna array. The pixel switching power amplifier back-off is then performed on the composite system. The efficiency of the system depends on the required relative EIRP levels of the users and is usually determined by the client that requires the maximum EIRP.

For a MIMO system, either a sub-array or a full array or a hybrid solution involving both of them can be used to communicate with multiple users. On the transmit side, as the data is known a priori, one can use a digital mapper. A digital mapper is a block that can automatically decide the array configuration and the waveform constellation by estimating the distance of each user from the base station. This allows one to choose the best configuration (with highest throughput) for the communication link. For example, different users can be distributed across the array in order to keep the peak to average peak ratio relatively constant. For example, if User 1 is in back-off mode, then only half the elements of the array are in use. If User 2 comes in at half power, it would be better to map User 2 to the off elements in the array.

The performance of a receiver is determined by its dynamic range, which is the ratio of the maximum input signal it can handle (without distortion) versus the minimum signal it can detect (limited by noise). The concept of switching pixel power amplifier architecture can also be applied to the receiver design. When the input signal to be detected has a low signal to noise ratio (SNR), more antenna elements can be utilized to detect the signal. This results in an SNR benefit of 10 log(N) (in dB), where N is the number of receiver elements that are turned on. When the input signal to be detected has a high SNR, lower number of antenna elements are used (others are turned off) to lower the antenna gain to reduce distortion. This technique therefore improves the dynamic range of the receiver. However, the efficiency benefits for the whole system (transceiver) is minimal as the receiver consumes much lower power than the transmitter.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, comprising:
an array of power amplifiers;
a power detector to collect a power signal applied to the array of power amplifiers; and
digital logic connected to the array of power amplifiers and the power detector, the digital logic configured to evaluate the power signal and select an array pattern from a set of array patterns and generate a control signal to implement the array pattern on the array of power amplifiers, wherein each array pattern in the set of array patterns includes at least one operative power amplifier;
wherein the array pattern is different than a previous array pattern, wherein the previous array patterns has a first set of power amplifiers operating at peak efficiency and a previous power amplifier with output power below a cut-off point, and the array pattern has a new set of power amplifiers operating at peak efficiency and a new power amplifier operating in a continuous manner above the cut-off point.

2. The apparatus of claim 1 wherein the array pattern has a majority of power amplifiers operating at peak efficiency level.

3. The apparatus of claim 2 wherein the array pattern has a minority of power amplifiers whose output power changes with the power signal.

4. The apparatus of claim 1 wherein the digital logic is configured to select the array pattern based upon a power amplifier configuration that adds hysteresis to the array of power amplifiers and thereby prevents excessive switching of power amplifiers.

5. The apparatus of claim 1 wherein the digital logic is configured to select the array pattern and generate the control signal during a dead zone period of no signal transmission.

6. The apparatus of claim 1 wherein the array of power amplifiers is one of a plurality of arrays of power amplifiers in a multiple-input and multiple-output (MIMO) system and wherein the digital logic is configured to estimate distances from users and determine for each user whether a full array of the MIMO system or a sub-array of the MIMO system is utilized.

7. An apparatus, comprising:
an array power amplifier;
a power detector to collect a power signal applied to the array of power amplifiers;
digital logic connected to the array of power amplifiers and the power detector, the digital logic configured to evaluate the power signal and select an array pattern from a set of array patterns and generate a control signal to implement the array pattern on the array of power amplifiers, wherein each array pattern in the set of array patterns includes at least one operative power amplifier; and
an asymmetric power divider connected to the array of power amplifiers and the digital logic, the asymmetric power divider splitting the power signal into N parts with N−1 parts being substantially equal and constant to achieve peak power amplifier efficiency and a single part with power at varies based on the power signal.

8. The apparatus claim 7 wherein each power amplifier in the array of power has linear operation for a peak to average power ratio.

9. The apparatus of claim 7 wherein the digital logic is configured to implement a dynamic power back-off in which power amplifiers of the array of power amplifiers are turned on and off based on the power signal.

10. The apparatus of claim 7 wherein the digital logic is configured to select an array pattern the produces minimal side lobes.

11. The apparatus of claim 7 wherein each power amplifier in the array of power amplifiers is a segment of a transmitter chain that includes an analog-to-digital converter, a filter, a mixer and an antenna.

12. The apparatus of claim 7 wherein each power amplifier in the array of power amplifiers is a segment of a transmitter chain that includes a variable gain amplifier and a phase shifter.

13. An apparatus, comprising:
an array of power amplifiers;
a power detector to collect a power signal applied to the array of power amplifiers; and
digital logic connected to the array of power amplifiers and the power detector, the digital logic configured to evaluate the power signal and select an array pattern from a set of array patterns and generate a control signal to implement the array pattern on the array of power amplifiers, wherein each array pattern in the set of array patterns includes at least one operative power amplifier;
wherein the array of power amplifiers is a two dimensional array of power amplifiers and the digital logic selects an array pattern that includes at least one of a new row of power amplifiers turned on, a new column of amplifiers turned on and a mixed power amplifier collection turned on.

14. The apparatus of claim 13 wherein the digital logic is configured to implement a static power back-off in which the average power of the array of power amplifiers is changed based on a geographic relationship between a client device and the array of power amplifiers.

15. The apparatus of claim 14 wherein the array of power amplifiers is one of a plurality of arrays of power amplifiers in a multiple-input and multiple-output (MIMO) system with a sub-array of power amplifiers that implements the static power back-off for a user.

16. The apparatus of claim 14 wherein the array of power amplifiers is one of a plurality of arrays of power amplifiers in a multiple-input and multiple-output (MIMO) system that implements the static power back-off based upon a combination of user streams that are applied to the MIMO system with appropriate phase shifts, such that the static power back-off for an individual user depends on the relative power levels of the different user streams in the combination.

* * * * *